United States Patent
Ang et al.

(10) Patent No.: US 7,202,140 B1
(45) Date of Patent: Apr. 10, 2007

(54) METHOD TO FABRICATE GE AND SI DEVICES TOGETHER FOR PERFORMANCE ENHANCEMENT

(75) Inventors: Chew Hoe Ang, Singapore (SG); Dong Kyun Sohn, Singapore (SG); Liang Choo Hsia, Singapore (SG)

(73) Assignee: Chartered Semiconductor Manufacturing, Ltd, Singapore (SG)

( * ) Notice: Subject to any disclaimer, the term of this patent is extended or adjusted under 35 U.S.C. 154(b) by 0 days.

(21) Appl. No.: 11/297,540

(22) Filed: Dec. 7, 2005

(51) Int. Cl.
*H01L 21/30* (2006.01)

(52) U.S. Cl. .................. 438/455; 438/667; 257/621; 257/E21.088

(58) Field of Classification Search .............. 438/48, 438/406, 455, 459, 629, 667, 672; 257/621
See application file for complete search history.

(56) References Cited

U.S. PATENT DOCUMENTS

| | | | |
|---|---|---|---|
| 6,150,708 A | 11/2000 | Gardner et al. | |
| 6,194,290 B1 | 2/2001 | Kub | |
| 6,451,634 B2 | 9/2002 | Ma et al. | |
| 6,774,010 B2 | 8/2004 | Chu et al. | |
| 6,774,447 B2 | 8/2004 | Kondo et al. | |
| 7,101,773 B2 * | 9/2006 | Danel .................. | 438/455 |
| 2002/0195602 A1 | 12/2002 | Klosowiak | |
| 2004/0072409 A1 | 4/2004 | Fitzgerald et al. | |
| 2004/0084720 A1 | 5/2004 | Esser et al. | |
| 2004/0106268 A1 | 6/2004 | Shaheen et al. | |
| 2004/0137698 A1 | 7/2004 | Taraschi et al. | |

OTHER PUBLICATIONS

Chow, et al., Process Compatible Polysilicon-Based Electrical Through-Wafer Interconnects in Silicon Substrates, Journal of Microelectromechanical Systems, vol. 11, No. 6, Dec. 2002 631. discusses using wafer bonding in combination with thru wafer interconnects.

Laura Peters, Wafer Bonding Enables New Technologies and Applications, Nov. 1, 2003 Semiconductor International , http://www.reed-electronics.com/semiconductor/index.asp?layout=article Print&articleID=CA331034.—discusses various wafer bonding techniques and applications.

(Continued)

*Primary Examiner*—Quoc Hoang
(74) *Attorney, Agent, or Firm*—William J. Stoffel

(57) ABSTRACT

A method for forming a semiconductor structure having devices formed on both sides. A first substrate and a second substrate are provided. The first substrate is preferably comprised of Ge. The second substrate is preferably comprised of silicon. We form a first dielectric layer over the first substrate. We form a first insulating layer over the second substrate. We bond the first dielectric layer and the first dielectric layer to form a first structure. The first structure comprised of the first substrate, an insulation layer (combined first dielectric and first insulating layers) and the second substrate. We reduce the thickness of the first substrate. We form via plugs through the first substrate and the insulation layer and at least partially through the second substrate. We form first active devices on the surface of the first substrate. We form a first capping layer over the first active devices and the first substrate. We reduce the thickness of the second substrate to expose the via plugs. We form second active devices on the second substrate.

20 Claims, 4 Drawing Sheets

OTHER PUBLICATIONS

Moon, J.S. ; Simmons, J.A. ; Wendt, J.R. ; Hietala, V.M. ; Reno, J.L. ; Baca, W.E. ; Blount, M.A., Title Dual-Side Wafer Processing and Resonant Tunneling Transistor Applications, Publication Date Jul. 20, 1999, OSTI Identifier OSTI ID: 9577 website: http://www.osti.gov/bridge/servlets/purl/9577-hwRMde/webviewable/9577.pdf.

* cited by examiner

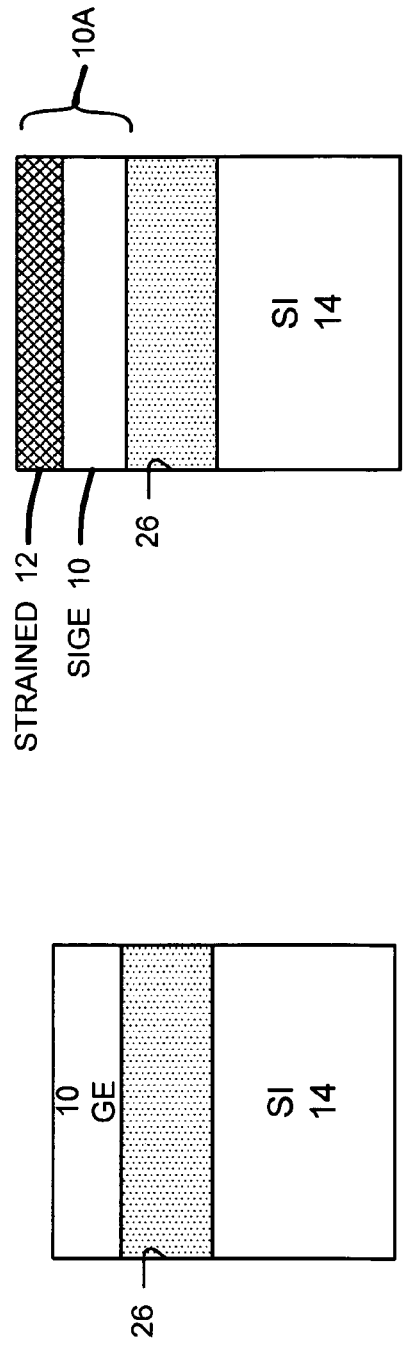
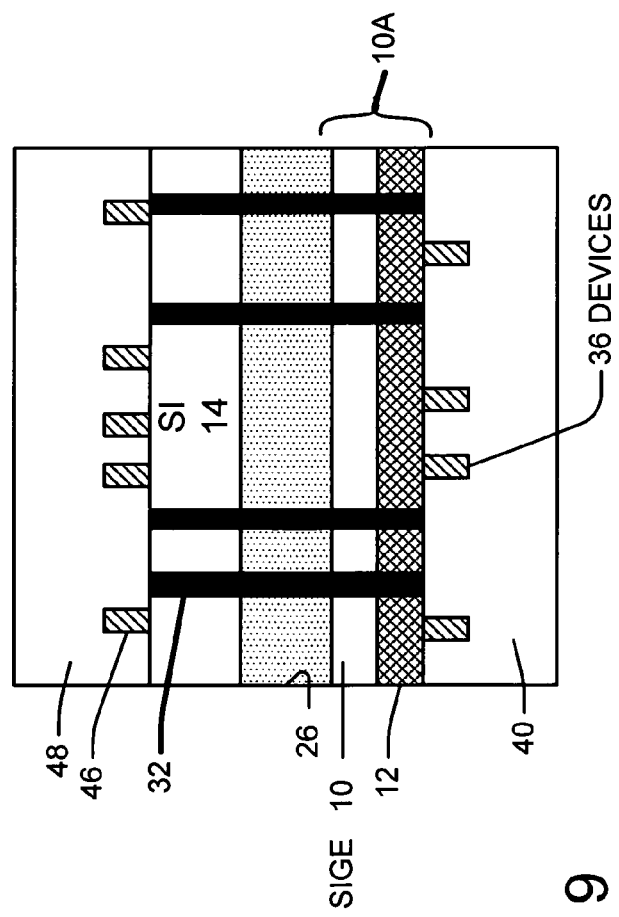
FIGURE 1C
FIGURE 1B
FIGURE 9

METHOD TO FABRICATE GE AND SI DEVICES TOGETHER FOR PERFORMANCE ENHANCEMENT

BACKGROUND OF INVENTION

1) Field of the Invention

This invention relates generally to fabrication of semiconductor devices and more particularly to the fabrication of a semiconductor structure having devices on both sides of the structure.

2) Description of the Prior Art

Mobility degradation is a major concern for transistor scaling due to higher channel doping, higher vertical field, and the use of high-k gate dielectric materials. In addition, due to the different substrate requirements for carrier mobility enhancement in NMOS and PMOS devices, the current technology for forming CMOS devices on the same substrate/platform will face severe limitations in the future. For e.g., it is known that Ge hole mobility is much higher than Si hole mobility.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

Chow, et al., Process Compatible Polysilicon-Based Electrical Through-Wafer Interconnects in Silicon Substrates, JOURNAL OF MICROELECTROMECHANICAL SYSTEMS, VOL. 11, NO. 6, DECEMBER 2002 631. thru wafer interconnects.

US 2004/0106268 Shaheen et al. shows a wafer bonding process.

US 2002/0195602—Klosowiak shows a process for a substrate.

US 20040072409 Fitzgerald, et al. Apr. 15, 2004—Coplanar integration of lattice-mismatched semiconductor with silicon via wafer bonding virtual substrates.

U.S. Pat. No. 6,774,447B2 Han—shows a process for stacking multiple substrates.

U.S. Pat. No. 6,194,290B2 Kub et al.—shows a direct bonding technique.

Laura Peters, Wafer Bonding Enables New Technologies and Applications, Nov. 1, 2003, Semiconductor International, http://www.reed-electronics.com/semiconductor/index.asp?layout=articlePrint&articleID=CA331034.—discusses various wafer bonding techniques and applications.

SUMMARY OF THE INVENTION

The example embodiments of the present invention provide structures and methods of manufacturing a structure with devices on both sides which is characterized as follows.

A example embodiment of a method for forming a semiconductor structure having devices formed on both sides; comprises the steps of:

providing a first substrate and a second substrate; said first substrate is comprised of Ge; said second substrate is comprised of silicon;

forming a first dielectric layer over said first substrate;

forming a first insulating layer over said second substrate;

bonding said first dielectric layer and said first dielectric layer to form a first structure; said first structure comprised of the first substrate, an insulation layer and the second substrate; the bonded first dielectric layer and the first insulating layer forms the insulation layer;

removing a portion of the first substrate to reduce the thickness of the first substrate;

forming via plugs through the first substrate and the insulation layer and at least partially through said second substrate;

forming first active devices on the surface of said first substrate;

forming a first capping layer over the first active devices and the first substrate;

removing a portion of the second substrate to reduce the thickness of the second substrate to expose said interconnects;

forming second active devices on the second substrate.

Additional embodiments and aspects are represented in the claims as submitted and amended.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A, 2, 3, 4, 5, 6, 7, 8, and 9, are cross sectional views for illustrating a structure and a method for manufacturing a semiconductor structure with devices on both sides according to an example embodiment of the present invention.

FIGS. 1B and 1C are cross sectional views for illustrating a structure and a method for manufacturing a semiconductor structure with a stained layer on a substrate according to a second example embodiment of the present invention.

FIG. 9 is cross sectional view for illustrating a structure and a method for manufacturing a semiconductor structure with a stained layer over a substrate according to the second example embodiment of the present invention.

DETAILED DESCRIPTION OF THE EXAMPLE EMBODIMENTS

The example embodiments of the present invention describe a structure and method to form devices on bonded together semiconductor substrates. In an embodiment, Ge and Si devices are formed together in order to enhance the performance of NMOS and PMOS transistors. There are 2 embodiments of the present invention as described below. In the second example embodiment a strained layer is formed over at least one substrate.

I. First Example Embodiment

The method for the first embodiment is show in FIGS. 1A, and 2 to 8. The embodiment is a method for forming a semiconductor structure having devices formed on both sides.

Figure 1A:
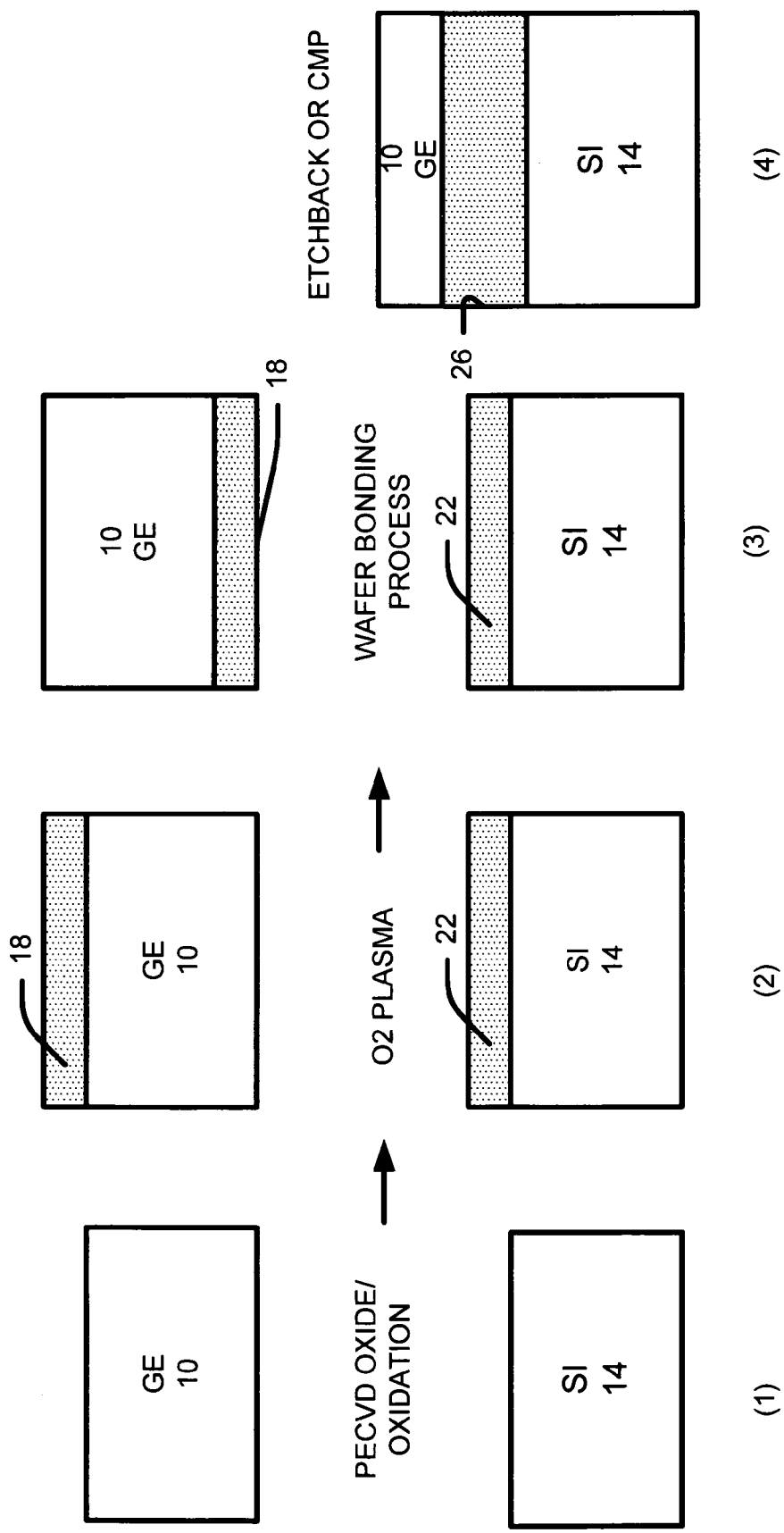

Referring to FIG. 1A we provide a first substrate 10 and a second substrate 12. The first substrate 10 is preferably comprised of Ge. The second substrate 14 is preferably comprised of silicon.

The first substrate 10 preferably is a wafer consisting essentially of Ge wafer with (100) surface orientation and resistivity ranging from 8 to 30 ohm-cm. The first substrate preferably has a thickness between 100 μm and 800 μm. In an aspect, the first substrate is a structure with the top surface or layer comprised of Ge and more preferably consisting of Ge.

The second substrate 14 is a preferably wafer consisting essentially of Si. The second substrate can be a Wafer with (100) surface orientation and resistivity ranging from 8 to 30 ohm-cm The second substrate preferably has a thickness between 100 μm and 800 μm. In an aspect, the top surface or layer of the second substrate 14 is comprised of Si and preferably consists essentially of Si.

We form a first dielectric layer 18 over the first substrate 10. The first dielectric layer is preferably comprise of an oxide. The first dielectric layer 18 preferably has a thickness between 1000 and 10000 Å. The first dielectric layer is preferably comprised of silicon oxide formed by a CVD or PECVD process.

We form a first insulating layer 22 over the second substrate 14. The first insulating layer 22 is preferably comprise of an oxide. The first insulating layer 22 is preferably comprised of silicon oxide formed by a CVD or PECVD or thermal oxidation process.

Next, we preferably clean the surface of the first dielectric layer 18 and the first insulating layer 22 using a O₂ plasma clean treatment.

A. Wafer Bonding

Next, we bond the first dielectric layer 18 and the first insulating layer 22 to form a first structure (10 26 14). The combined first dielectric layer 18 and the first insulating layer 22 are now called the insulation layer 26 (18 22). The first structure comprised of the first substrate 10, an insulation layer 26 (18 22) (or buried oxide layer) and the second substrate 14.

In a bonding process, the PECVD oxide 18 on the Ge substrate 10 can be readily bonded to the thermal oxide 22 at room temperature after piranha clean that leaves the wafer surface hydrophilic. A bonding anneal at about between 200 and 400 degree C. will then complete the bonding process.

Still referring to FIG. 1A, we reduce the thickness of the first substrate 10. The reduction of the thickness of the first substrate 10 is preferably performed by an etch back or CMP process. After the thinning process, the first substrate 10 has a thickness between 5 and 20 nm. After the thinning, the first substrate can be have thickness between 0.6% and 5% of it's thickness before thinning.

B. Via Plugs

Figure 3:
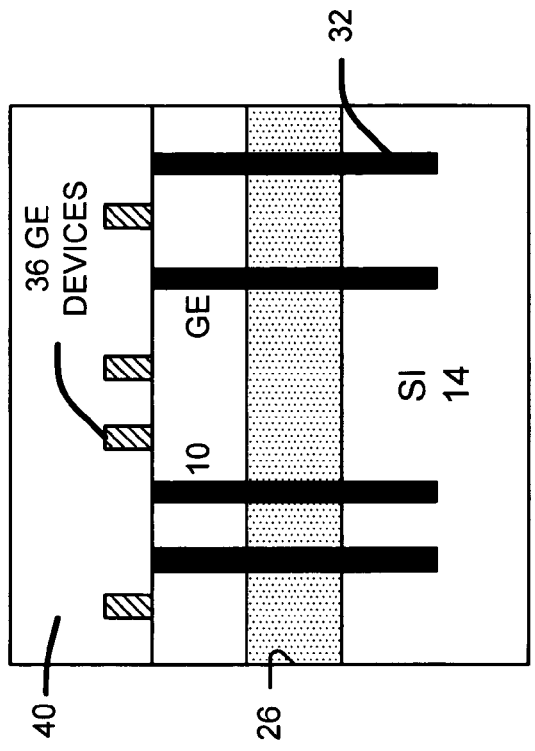
Figure 2:
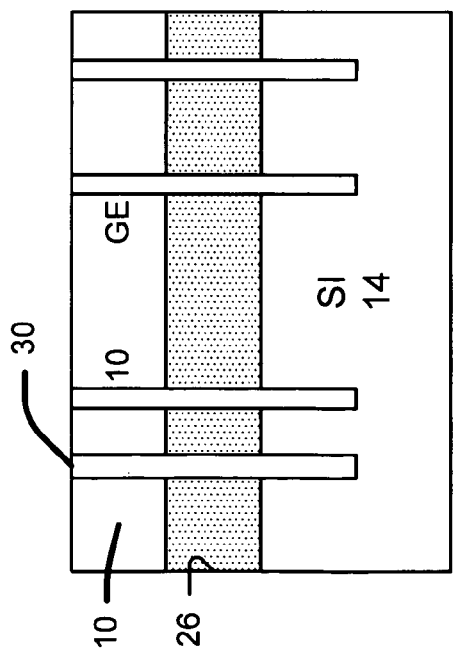

Referring to FIGS. 2 and 3, we form via plugs 32 through the first substrate 10 and the insulation layer 26 and at least partially through the second substrate 14.

As shown FIG. 2, we form via openings 30 through the first substrate 10 and the insulation layer 26 and at least partially through the second substrate 14. For filling up these via openings, the opening profile are maintained about straight or slightly positively sloped. Referring to FIG. 3, we fill the interconnect openings 30 with a conductive material to form interconnects 32. The vias are filled preferably by CVD process. The conductive material is preferably comprised Ti, TiN, W or doped polysilicon. It is important to ensure the via plugs (e.g., filling) is intact without void or weak points in the via opening, which may result in shorts or opens.

C. First Active Devices

Figure 4:
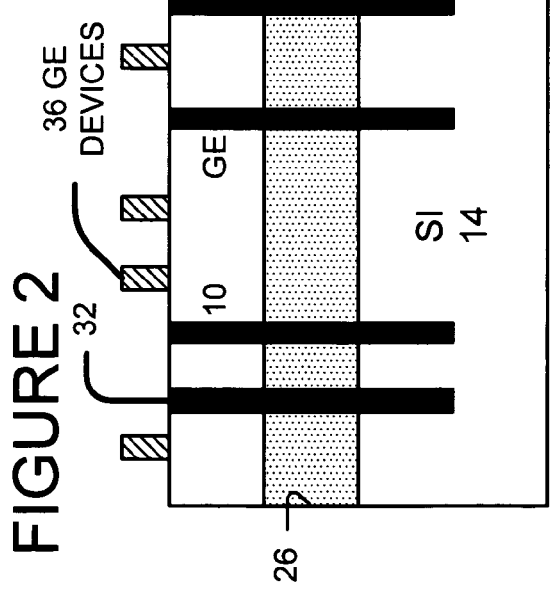

As shown in FIG. 4, we form first active devices 36 on the surface of the first substrate 20.

The active devices can be BJT, FET transistors and/or diodes. The first active devices preferably comprise CMOS FET with source/drain and gate electrodes.

Figure 5:
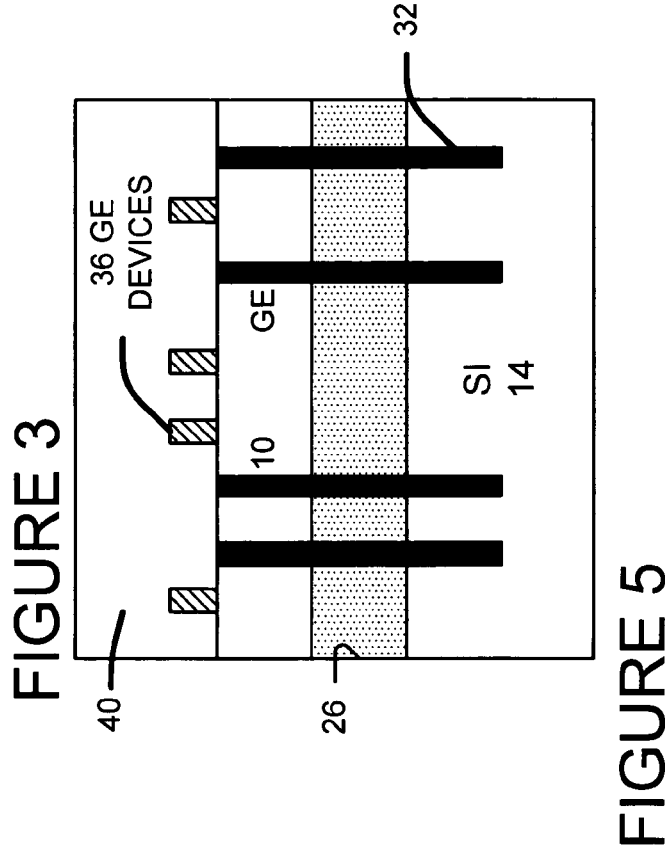

Referring to FIG. 5, we form a first capping layer 40 over the first active devices 36 and the first substrate 10. The first capping layer 40 is preferably comprised of silicon oxide or silicon nitride or composite of silicon oxide/silicon nitride layers and preferably has thickness between 1000 and 8000 Å.

Figure 6:
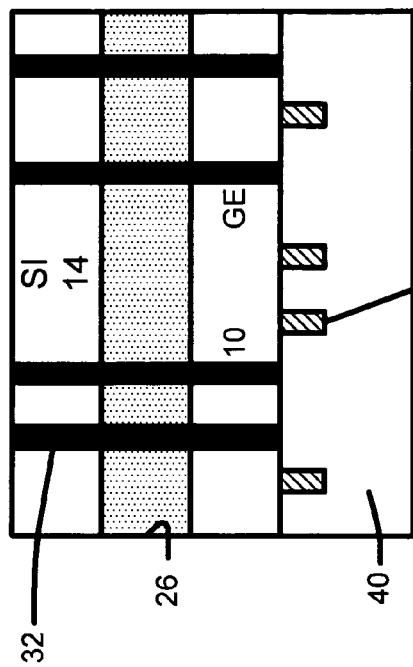

FIG. 6 shows the structure turned over compared to FIG. 5.

Figure 7:
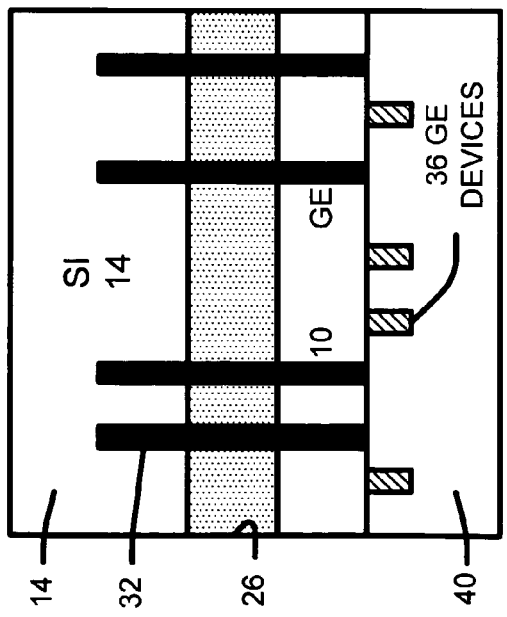

As shown in FIG. 7, we reduce the thickness of the second substrate 14 to expose the via plugs 32. We remove a portion of the second substrate 14.

The reduction of the thickness of the second substrate 14 is preferably performed by an etch back or CMP process. After the reduction, the second substrate 14 preferably has a thickness between 5 and 20 nm.

The first cap layer 40 protects the surface of the first substrate and first active devices.

D. Second Active Devices on the Second Substrate

Figure 8:
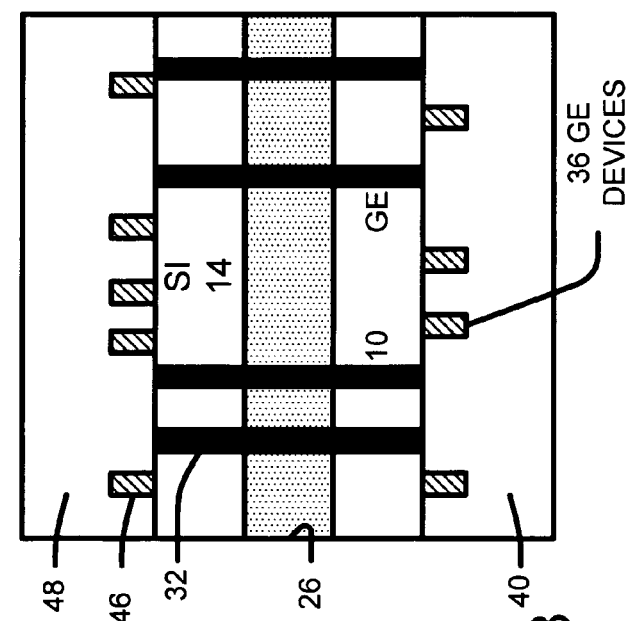

As shown in FIG. 8, we form second active devices 46 on the second substrate 14.

The second active devices are preferably comprised of BJT or CMOSFET devices with source/drain and gate electrodes, and/or diodes.

It is important to keep the thermal budget low for the formation of Si active devices on the Si substrate such as replacing the conventional thermal gate oxidation process by low-temperature deposition process, so as not to unduly affect the Ge devices on the Ge substrate.

A passivation layer 48 can be formed over the Si devices.

More levels of interconnects, as desired, can be formed subsequently. There are few options: (1) All the interconnects (M1 to Mn) associated with the Ge devices can be formed after FIG. 5 before proceeding to fabricate the Si devices and their interconnects, or (2) the interconnects for Ge and Si devices can be processed concurrently.

E. 2nd Example Embodiment

Strained Layers

In a second example embodiment of the invention, referring to FIGS. 1B and 1C, a strained Si or Strained Ge layer 12 is formed over the first substrate 10 to form strained substrate (10 12) 10A. The first substrate is comprised of relaxed SiGe buffer layer.

The second embodiment uses the method discussed above for the 1st embodiment. The process is the same as shown in FIG. 1A.

Referring to FIGS. 1B and 1C, we form a strained Si or Strained Ge layer 12 over the first substrate 10. The strained Si or Ge are epitaxially grown on the relaxed SiGe buffer to give rise to biaxially tensile Si or Ge film where the thickness is below its respective critical value for preventing excessive generation of dislocation and strain relaxation.

The processes continues as discussed above (see FIGS. 2–8).

FIG. 9 shows the structure after devices are strained Si or Ge devices 36 and Si 46 devices are formed.

Due to the enhanced mobility of electrons and holes in the strained Si or Ge films, the speed of the devices can be further enhanced.

F. First Example Structure Embodiment

FIG. 8

An example embodiment of a device is shown in FIG. 8. FIG. 8 is a new example architecture to form Si and Ge devices back to back. An example semiconductor structure having devices formed on both sides; is comprised of:
- a first substrate 10 and a second substrate 12; the first substrate 10 is comprised of Ge; the second substrate 12 is comprised of silicon;
- a first dielectric layer 18 over the first substrate 10;
- a first insulating layer 22 over the second substrate 14;
- the first dielectric layer 18 and the first dielectric layer 22 bonded together to form a first structure (10 26 14);
- the first structure is comprised of the first substrate 10, an insulation layer 26 (18 22) and the second substrate 14; the bonded first dielectric layer and the first insulating layer form the insulation layer 26;
- via plugs through the first substrate 10 and the insulation layer 26 and through the second substrate 14;
- first active devices 36 on the surface of the first substrate 20;
- a first capping layer 40 over the first active devices 36 and the first substrate 10;
- second active devices 46 on the surface of the second substrate 14.

G. Second Example Structure Embodiment

FIG. 9

FIG. 9 is another possible embodiment of this invention. Using the described example method above, we are also able to form Si and SiGe/strained Si devices back to back. In FIG. 9, a strained layer comprised of Si or Ge is over said first substrate. The strained layer forms the top surface of the first substrate. In an option, the first substrate is comprised of relaxed SiGe.

H. Non-Limiting Example Embodiments

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor structure having devices formed on both sides; comprising the steps of:
   a) providing a first substrate and a second substrate; said first substrate is comprised of Ge; said second substrate is comprised of silicon;
   b) forming a first dielectric layer over said first substrate;
   c) forming a first insulating layer over said second substrate;
   d) bonding said first dielectric layer and said first insulating layer to form a first structure; said first structure comprised of the first substrate, an insulation layer and the second substrate; the bonded first dielectric layer and the first insulating layer form the insulation layer;
   e) removing a portion of the first substrate to reduce the thickness of the first substrate;
   f) forming via plugs through the first substrate and the insulation layer and at least partially through said second substrate;
   g) forming first active devices on the surface of said first substrate;
   h) forming a first capping layer over the first active devices and the first substrate;
   i) removing a portion of the second substrate to reduce the thickness of the second substrate to expose said via plugs; and
   j) forming second active devices on the second substrate.

2. The method of claim 1 wherein:
   the first substrate is a wafer consisting essentially of Ge;
   the second substrate is a wafer consisting essentially of Si.

3. The method of claim 1 wherein before the step of bonding said first dielectric layer and said first insulating layer, further includes
   cleaning the surface of said first dielectric layer and said first insulating layer using a $O_2$ plasma clean treatment.

4. The method of claim 1 wherein the reduction of the thickness of the first substrate is performed by an etch back or CMP process; and after the reduction, the first substrate has a thickness between 5 and 20 nm.

5. The method of claim 1 wherein after the step of reducing the thickness of the first substrate, which further includes forming a strained layer comprised of Si or Ge over said first substrate; the strained layer forms the top surface of the first substrate; the first substrate is comprised of relaxed SiGe.

6. The method of claim 1 wherein the step of forming the via plugs comprises: forming via openings through the first substrate and the insulation layer and at least partially through said second substrate; and filling said via openings with a conductive material to form via plugs.

7. The method of claim 1 wherein the via plugs are comprised of a material selected from the group consisting of Ti, TiN, W and doped polysilicon.

8. The method of claim 1 wherein the reduction of the thickness of the second substrate is performed by an etch back or CMP process; the second substrate has a thickness between 5 and 20 nm.

9. The method of claim 1 wherein said first active devices and the second active devices are comprised of a CMOS device, or a BJT device.

10. A method for forming a semiconductor structure having devices formed on both sides; comprising the steps of:
   a) providing a first substrate and a second substrate; said first substrate is comprised of Ge; said second substrate is comprised of silicon;
   b) forming a first dielectric layer over said first substrate;
   c) forming a first insulating layer over said second substrate;
   d) bonding said first dielectric layer and said first insulating layer to form a first structure; said first structure comprised of the first substrate, an insulation layer and the second substrate; the bonded first dielectric layer and the first insulating layer form the insulation layer;
   e) forming via plugs through the first substrate and the insulation layer and at least partially through said second substrate;
   f) forming first active devices on the surface of said first substrate;
   g) forming a first capping layer over the first active devices and the first substrate; and
   h) forming second active devices on the second substrate.

11. The method of claim 10 which further comprises after step d) and before step e):
   d-1) removing a portion of the first substrate to reduce the thickness of the first substrate.

12. The method of claim 10 which further comprises after step g) and before step h):
   (g-1) removing a portion of the second substrate to reduce the thickness of the second substrate to expose said via plugs.

13. The method of claim 10 after step d) and before step e) which further comprises:
   (d-1) removing a portion of the first substrate to reduce the thickness of the first substrate;
   (d-2) forming a strained layer comprised of Si or Ge over said first substrate; the strained layer forms the top surface of the first substrate; the first substrate is comprised of relaxed SiGe.

14. The method of claim 10 wherein the step of forming the via plugs comprises: forming via openings through the first substrate and the insulation layer and at least partially through said second substrate; and filling said via openings with a conductive material to form the via plugs.

15. A method for forming a semiconductor structure having devices formed on both sides; comprising the steps of:
   a) providing a first substrate and a second substrate;
   b) forming a first dielectric layer over said first substrate;
   c) forming a first insulating layer over said second substrate;
   d) bonding said first dielectric layer and said first insulating layer to form a first structure; said first structure comprised of the first substrate, an insulation layer and the second substrate; the bonded first dielectric layer and the first insulating layer form the insulation layer;
   e) forming via plugs through the first substrate and the insulation layer and at least partially through said second substrate;
   f) forming first active devices on the surface of said first substrate;
   g) forming a first capping layer over the first active devices and the first substrate; and
   h) forming second active devices on the second substrate.

16. The method of claim 15 which further comprises said first substrate is comprised of Ge; said second substrate is comprised of silicon.

17. The method of claim 15 which further comprises after step d) and before step e):
   d-1) removing a portion of the first substrate to reduce the thickness of the first substrate.

18. The method of claim 15 which further comprises after step g) and before step h):
   (g-1) removing a portion of the second substrate to reduce the thickness of the second substrate to expose said via plugs.

19. The method of claim 15 after step d) and before step e) which further comprises:
   (d-1) removing a portion of the first substrate to reduce the thickness of the first substrate;
   (d-2) forming a strained layer comprised of Si or Ge over said first substrate; the strained layer forms the top surface of the first substrate; the first substrate is comprised of relaxed SiGe.

20. The method of claim 15 wherein the step of forming the via plugs comprises:
   forming via openings through the first substrate and the insulation layer and at least partially through said second substrate; and
   filling said via openings with a conductive material to form the via plugs.

* * * * *